United States Patent
Kato et al.

(10) Patent No.: US 7,880,392 B2
(45) Date of Patent: Feb. 1, 2011

(54) PLASMA PRODUCING METHOD AND APPARATUS AS WELL AS PLASMA PROCESSING APPARATUS

(75) Inventors: Kenji Kato, Kyoto (JP); Hiroshige Deguchi, Kyoto (JP); Hitoshi Yoneda, Kyoto (JP); Kiyoshi Kubota, Kyoto (JP); Akinori Ebe, Kyoto (JP); Yuichi Setsuhara, Osaka (JP)

(73) Assignees: Nissin Electric Co., Ltd., Kyoto (JP); EMD Corporation, Kyoto (JP)

( * ) Notice: Subject to any disclaimer, the term of this patent is extended or adjusted under 35 U.S.C. 154(b) by 931 days.

(21) Appl. No.: 11/586,583

(22) Filed: Oct. 26, 2006

(65) Prior Publication Data

US 2007/0095287 A1 May 3, 2007

(30) Foreign Application Priority Data

Oct. 28, 2005 (JP) ............................. 2005-313594
Jun. 29, 2006 (JP) ............................. 2006-178858

(51) Int. Cl.
*C23C 16/00* (2006.01)
(52) U.S. Cl. ......................... 315/111.21; 315/111.51; 315/111.71; 118/723 AN
(58) Field of Classification Search ................ 315/315, 315/111.21, 111.31, 111.41, 111.51, 111.61, 315/111.71; 118/723 I, 723 AN, 723 MW
See application file for complete search history.

(56) References Cited

U.S. PATENT DOCUMENTS

| | | | |
|---|---|---|---|
| 6,667,577 B2 * | 12/2003 | Shannon et al. | 315/111.21 |
| 7,098,599 B2 * | 8/2006 | Miyake et al. | 315/111.21 |
| 2006/0057854 A1 * | 3/2006 | Setsuhara et al. | 438/710 |
| 2007/0056846 A1 | 3/2007 | Takahashi et al. | |
| 2007/0063183 A1 | 3/2007 | Kato et al. | |
| 2007/0123004 A1 | 5/2007 | Takahashi et al. | |
| 2007/0144440 A1 | 6/2007 | Yoneda et al. | |
| 2007/0144672 A1 | 6/2007 | Kato et al. | |
| 2007/0158182 A1 | 7/2007 | Takahashi et al. | |
| 2008/0035471 A1 | 2/2008 | Mikami et al. | |

FOREIGN PATENT DOCUMENTS

| JP | 08-031358 | 2/1996 |
|---|---|---|
| JP | 09-245997 | 9/1997 |
| JP | 11-074251 | 3/1999 |
| JP | 2004-200233 | 7/2004 |
| JP | 2004-311975 | 11/2004 |
| JP | 2004-349199 | 12/2004 |

* cited by examiner

*Primary Examiner*—David Hung Vu
(74) *Attorney, Agent, or Firm*—Cheng Law Group, PLLC (57) ABSTRACT

Plasma producing method and apparatus wherein a plurality of high-frequency antennas are arranged in a plasma producing chamber, and a high-frequency power supplied from a high-frequency power supply device (including a power source, a phase controller and the like) is applied to a gas in the chamber from the antennas to produce inductively coupled plasma. At least some of the plurality of high-frequency antennas are arranged in a fashion of such parallel arrangement that the antennas successively neighbor to each other and each of the antennas is opposed to the neighboring antenna. The high-frequency power supply device controls a phase of a high-frequency voltage applied to each antenna, and thereby controls an electron temperature of the inductively coupled plasma.

16 Claims, 9 Drawing Sheets

SET OF
PHASE DIFFERENCE : REFERENCE    180°      0°
         OR :        180°    REFERENCE   180°

Fig.10

SET OF
PHASE DIFFERENCE : REFERENCE    0°     0°     0°

PLASMA PRODUCING METHOD AND APPARATUS AS WELL AS PLASMA PROCESSING APPARATUS

CROSS-REFERENCE TO RELATED APPLICATION

This invention is based on Japanese Patent application No. 2005-313594 filed in Japan on Oct. 28, 2005 and Japanese Patent application No. 2006-178858 filed in Japan on Jun. 29, 2006, the entire contents of which are hereby incorporated by reference.

BACKGROUND OF THE INVENTION

1. Field of the Invention

The invention relates to a plasma producing method and apparatus for producing gas plasma as well as a plasma processing apparatus using the plasma producing apparatus, i.e., a plasma processing apparatus effecting intended processing on a work or target in plasma.

2. Description of the Related Art

Plasma is used, e.g., in plasma CVD method and apparatus forming a film in plasma, method and apparatus forming a film by effecting sputtering on a sputter target in plasma, method and apparatus performing etching in plasma, and method, apparatus and the like used for performing ion implantation or ion doping by extracting ions from plasma. Further, the plasma is used in various apparatuses utilizing the plasma such as apparatuses producing various semiconductor devices (e.g., thin-film transistors used in liquid crystal displays or the like), material substrates thereof or the like by using the foregoing methods and/or apparatuses.

Various types of plasma producing methods and apparatuses have been known and, for example, such types have been known that produces capacitively coupled plasma, produces inductively coupled plasma or ECR (Electron Cyclotron Resonance) plasma or produces microwave plasma.

Among them, the plasma producing method and apparatus producing the inductively coupled plasma are configured to obtain plasma of extremely high density and uniformity in a plasma producing chamber and, for this purpose, has a high-frequency antenna for the plasma producing chamber for producing the inductively coupled plasma by applying a high-frequency power from the high-frequency antenna to a gas in the chamber. More specifically, the high-frequency power is supplied to the high-frequency antenna to generate an induction electromagnetic field in the plasma producing chamber, and the induction electromagnetic field produces the inductively coupled plasma.

The high-frequency antenna may be arranged outside the plasma producing chamber, but it is also proposed to arrange it inside the plasma producing chamber for improving use efficiency of the supplied high-frequency power and other purposes.

For example, it is described in Japanese Laid-Open Patent Publication No. 2004-200233 (JP2004-200233A) that high-frequency antennas are arranged inside a plasma producing chamber, and the plurality of high-frequency antennas arranged in the plasma producing chamber are successively and linearly arranged on the same plane, and the neighboring electrodes of the neighboring antennas have the same polarity to uniformize the plasma density distribution and improve the plasma density,.

An electron temperature (in other words, energy of electrons) in the plasma affects cutting of interatomic coupling of a substance exposed to the plasma, and the higher electron temperature causes cutting of the interatomic coupling to a higher extent. In the plasma processing, therefore, it is desired to control the electron temperature of the plasma and particularly to lower the electron temperature, e.g.,for the purpose of suppressing damages to a work and the like due to plasma, or performing desired etching processing. For example, in the case where a silicon thin film for a bottom-gate-type TFT is formed by a plasma CVD method, such a method is generally employed that the silicon thin film is formed on a substrate on which a gate insulating film (e.g., made of silicon nitride, silicon oxide or a mixture thereof) was deposited. When the electron temperature of the plasma is high when forming the silicon thin film, defects may occur, e.g., at the gate insulating film or the silicon thin film.

In connection with this, Japanese Laid-Open Patent Publication No. H11-74251 (JP11-74251A) has disclosed that an ion temperature lowers when an electron temperature in plasma becomes equal to 3 eV or lower in the plasma CVD method, and therefore, ion damages to a target substrate can be lowered in the plasma CVD.

As a manner of setting the electron temperature of 3 eV or lower, it is disclosed to generate higher-density plasma in a projection portion of the plasma producing chamber (vacuum container), in which a static magnetic field for controlling the plasma state is not present, than in the vicinity of the work substrate.

Japanese Laid-Open Patent Publication No. 2004-311975 (JP2004-311975A) has disclosed that excessive decomposition of a material gas is prevented to form a good insulating film in the plasma CVD method by keeping the electron temperature at 3 eV or lower in a plasma generating space.

As a manner of setting the electron temperature at 3 eV or lower, it is disclosed to produce microwave plasma, and to employ a plane antenna member that is connected to a waveguide of the microwave and is provided with a large number of slits in a peripheral direction of the antenna member.

According to JP2004-200233A, the uniformity of the plasma density distribution and the plasma density can be improved by arranging the plurality of high-frequency antennas in the plasma producing chamber and employing the neighboring electrodes of the same polarity in the neighboring antennas. However, this reference has not referred to suppression of the electron temperature of the plasma.

JP11-74251A and JP2004-311975A have referred to suppression of the electron temperature. For such suppression, the former has disclosed that the higher-density plasma is generated in the projection portion of the plasma producing chamber (vacuum chamber), in which a static magnetic field for controlling the plasma state is not present, than in the vicinity of the work substrate. According to this structure, the plasma producing chamber (vacuum container) must have the projection portion in which a static magnetic field for controlling the plasma state is not present.

The latter has disclosed the structure producing the microwave plasma, and employing the plane antenna member that is connected to the waveguide of the microwave and is provided with the large number of slits in a peripheral direction of the antenna member. It is necessary to prepare the antenna member having such a structure.

SUMMARY OF THE INVENTION

Accordingly, a first object of the invention is to provide a plasma producing method in which a plurality of high-frequency antennas are arranged in a plasma producing chamber, and an inductively coupled plasma is generated by applying a high-frequency power from the high-frequency antennas to a gas in the plasma producing chamber, and particularly a plasma producing method that can keep a low electron temperature in the plasma more readily than a conventional method without lowering a plasma density.

A second object of the invention is to provide a plasma producing apparatus including a plasma producing chamber, a plurality of high-frequency antennas arranged in the chamber and a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas, and particularly a plasma producing apparatus that can keep a low electron temperature in the plasma more readily than a conventional apparatus without lowering a plasma density.

A third object of the invention is to provide a plasma processing apparatus that can rapidly perform intended processing on a work or target while suppressing damages which may be caused to the work and the like by the plasma.

A fourth object of the invention is to provide a plasma processing apparatus that can rapidly perform intended processing on a work or target while suppressing damages which may be caused to the work and the like by the plasma, and further can perform plasma processing while suppressing unpreferable adhesion and mixture of impurities.

The inventors have conducted study for achieving the above objects, and have found the following.

In the structure of arranging a plurality of high-frequency antennas in the plasma producing chamber for producing the inductively coupled plasma, an electron temperature of the plasma can be controlled to be lower relatively readily by arranging all or some of the antennas among the plurality of high-frequency antennas in a fashion of such parallel arrangement that the antennas successively neighbor to each other and each of the antennas is opposed to the neighboring antenna, and by controlling a phase of the high-frequency voltage applied to each of the high-frequency antennas. By controlling the phase of the high-frequency voltage in the above manner, the plasma electron temperature that is kept low does not cause unignorable lowering of the plasma density, and the high-density plasma substantially corresponding to the number of the antennas and the like can be achieved.

Based on the above findings, the invention provides, for achieving the foregoing first object, a plasma producing method for producing an inductively coupled plasma by arranging a plurality of high-frequency antennas in a plasma producing chamber, and applying a high-frequency power to a gas in the plasma producing chamber from the high-frequency antennas, and particularly a plasma producing method, wherein at least some of the high-frequency antennas are arranged in a fashion of such parallel arrangement that the antennas successively neighbor to each other and each of the antennas is opposed to the neighboring antenna, control is conducted on a phase of a high-frequency voltage applied to each of the high-frequency antennas arranged in a fashion of the parallel arrangement such that the antennas successively neighbor to each other and each of the antennas is opposed to the neighboring antenna, and thereby an electron temperature of the inductively coupled plasma is controlled.

Also, the invention provides, for achieving the foregoing second object, a plasma producing apparatus having a plasma producing chamber, a plurality of high-frequency antennas arranged in the chamber and a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas, and particularly a plasma producing apparatus wherein at least some of the high-frequency antennas are arranged in a fashion of such parallel arrangement that the antennas successively neighbor to each other and each of the antennas is opposed to the neighboring antenna, the high-frequency power supply device controls a phase of a high-frequency voltage applied to each of the high-frequency antennas arranged in a fashion of the parallel arrangement such that the antennas successively neighbor to each other and each of the antennas is opposed to the neighboring antenna, and thereby an electron temperature of the inductively coupled plasma is controlled.

Further, the invention provides, for achieving the foregoing third object, a plasma processing apparatus for effecting intended processing on a work in plasma, and particularly a plasma processing apparatus including the plasma producing apparatus according to the invention.

Further, the invention provides, for achieving the foregoing fourth object, a plasma processing apparatus, in which a holder is arranged in the plasma producing chamber for holding the work with its plasma processing target surface opposed to the high-frequency antennas, and at least a part of an inner wall surface of the plasma producing chamber is covered with an electrically insulating material.

The foregoing and other objects, features, aspects and advantages of the present invention will become more apparent from the following detailed description when taken in conjunction with the accompanying drawings.

DESCRIPTION OF THE PREFERRED EMBODIMENTS

A plasma producing method of an embodiment of the invention is a plasma producing method for producing an inductively coupled plasma by arranging a plurality of high-frequency antennas in a plasma producing chamber, and applying a high-frequency power to a gas in the plasma producing chamber from the high-frequency antennas, and particularly a plasma producing method, wherein at least some of the high-frequency antennas are arranged in a fashion of such parallel arrangement that the antennas successively neighbor to each other and each of the antennas is opposed to the neighboring antenna, control is conducted on a phase of a high-frequency voltage applied to each of the high-frequency antennas arranged in a fashion of the parallel arrangement such that the antennas successively neighbor to each other and each of the antennas is opposed to the neighboring antenna, and thereby an electron temperature of the inductively coupled plasma is controlled.

A plasma producing apparatus of an embodiment of the invention is a plasma producing apparatus having a plasma producing chamber, a plurality of high-frequency antennas arranged in the chamber and a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas, and particularly a plasma producing apparatus wherein at least some of the high-frequency antennas are arranged in a fashion of such parallel arrangement that the antennas successively neighbor to each other and each of the antennas is opposed to the neighboring antenna, the high-frequency power supply device controls a phase of a high-frequency voltage applied to each of the high-frequency antennas arranged in a fashion of the parallel arrangement such that the antennas successively neighbor to each other and each of the antennas is opposed to the neighboring antenna, and thereby an electron temperature of the inductively coupled plasma is controlled.

According to the plasma producing method and the plasma producing apparatus, at least some of the high-frequency antennas among the plurality of high-frequency antennas arranged in the plasma producing chamber are arranged in a fashion of such parallel arrangement that the antennas successively neighbor to each other and each of the antennas is opposed to the neighboring antenna, and the control is effected on the phase of the high-frequency voltage applied to each of the high-frequency antennas arranged in a fashion of the parallel arrangement such that the antennas successively neighbor to each other and each of the antennas is opposed to the neighboring antenna. Thereby, the plasma electron temperature can be kept low. Further, unignorable problem does not occur in plasma density as already found, although the phase of the high-frequency voltage applied to each high-frequency antenna is controlled to lower the plasma electron temperature.

In the following examples, the phase of the high-frequency voltage applied to each high-frequency antenna can be controlled to lower the plasma electron temperature without causing unignorable problem in plasma density:

(1) In the plasma producing method, each of the high-frequency antennas arranged in a fashion of the parallel arrangement such that the antennas successively neighbor to each other and each of the antennas is opposed to the neighboring antenna is supplied with the high-frequency power such that the neighboring high-frequency antennas among the plurality of antennas have same polarity (in other words, the neighboring high-frequency antennas are supplied with the powers in the same direction, and thus are supplied with currents in the same direction), and phase difference in high-frequency voltage between the neighboring high-frequency antennas becomes equal to 180 degrees, or such that the neighboring high-frequency antennas among the plurality of antennas have opposite polarities, respectively, (in other words, the neighboring high-frequency antennas are supplied with the powers in the opposite directions, and thus are supplied with currents in the opposite directions, respectively), and phase difference in high-frequency voltage between the neighboring high-frequency antennas becomes equal to 0 degrees.

(2) In the plasma producing method, each of the high-frequency antennas arranged in a fashion of the parallel arrangement such that the antennas successively neighbor to each other and each of the antennas is opposed to the neighboring antenna is supplied with the high-frequency power such that the neighboring high-frequency antennas among the plurality of antennas have same polarity, and phase difference in high-frequency voltage between the neighboring high-frequency antennas becomes equal to 180 degrees.

(3) In the plasma producing method, each of the high-frequency antennas arranged in a fashion of the parallel arrangement such that the antennas successively neighbor to each other and each of the antennas is opposed to the neighboring antenna is supplied with the high-frequency power such that the neighboring high-frequency antennas among the plurality of antennas have opposite polarities, respectively, and phase difference in high-frequency voltage between the neighboring high-frequency antennas becomes equal to 0 degrees.

For the plasma producing apparatus, the following examples may be employed for the above phase control:

(1) In the plasma producing apparatus, each of the high-frequency antennas arranged in a fashion of such parallel arrangement that the antennas successively neighbor to each other and each of the antennas is opposed to the neighboring antenna is supplied with the high-frequency power from the high-frequency power supply device such that the neighboring high-frequency antennas among the plurality of antennas have same polarity, and phase difference in high-frequency voltage between the neighboring high-frequency antennas becomes equal to 180 degrees, or such that the neighboring high-frequency antennas among the plurality of antennas have opposite polarities, respectively, and phase difference in high-frequency voltage between the neighboring high-frequency antennas becomes equal to 0 degrees.

(2) In the plasma producing apparatus, each of the high-frequency antennas arranged in a fashion of the parallel arrangement such that the antennas successively neighbor to each other and each of the antennas is opposed to the neighboring antenna is supplied with the high-frequency power from the high-frequency power supply device such that the neighboring high-frequency antennas among the plurality of antennas have same polarity, and phase difference in high-frequency voltage between the neighboring high-frequency antennas becomes equal to 180 degrees.

(3) In the plasma producing apparatus, each of the high-frequency antennas arranged in a fashion of the parallel arrangement such that the antennas successively neighbor to each other and each of the antennas is opposed to the neighboring antenna is supplied with the high-frequency power from the high-frequency power supply device such that the neighboring high-frequency antennas among the plurality of antennas have opposite polarities, respectively, and phase difference in high-frequency voltage between the neighboring high-frequency antennas becomes equal to 0 degrees.

In the plasma producing method and apparatus described above, the high-frequency antenna may be a two-dimensional structure antenna (of a plane structure) that is terminated without circling. For example, the antenna may be formed by bending a linear or belt-like conductor, e.g., into a U-shaped or nearly U-shaped form.

In the plasma producing-method and apparatus the "parallel arrangement that each of the antennas is opposed to the neighboring antenna" in the "parallel arrangement that the antennas successively neighbor to each other and each of the antennas is opposed to the neighboring antenna" does not indicate such a state that the neighboring antennas are arranged on the same or substantially the same plane, and successively and serially neighbor linearly to each other, but indicates that the neighboring antennas are arranged on different planes parallel or substantially parallel to each other, respectively, are opposed to each other and are parallel or substantially parallel to each other. Shifting to a certain extent is allowed provided that the objects of the invention can be achieved.

In the plasma producing method and apparatus described above, all the plurality of high-frequency antennas arranged in the plasma producing chamber may be arranged in a fashion of such parallel arrangement that the antennas successively neighbor to each other and each of the antennas is opposed to the neighboring antenna, and control may be conducted on the phase of the high-frequency voltage applied to each of the high-frequency antennas (in the case of the plasma producing apparatus, by the high-frequency power supply device controlling the phase of the high-frequency voltage) to control the electron temperature of the inductively coupled plasma.

In the plasma producing method and apparatus described above, the plurality of high-frequency antennas arranged in the plasma producing chamber may be divided into a plurality of groups. The high-frequency antennas in all or some of the groups including two or more antennas may be arranged in a fashion of such parallel arrangement that the antennas successively neighbor to each other and each of the antennas is opposed to the neighboring antenna, and control may be conducted on the phase of the high-frequency voltage applied to each of the high-frequency antennas (in the case of the plasma producing apparatus, by the high-frequency power supply device controlling the phase of the high-frequency voltage) to control the electron temperature of the inductively coupled plasma.

A plasma processing apparatus of an embodiment of the invention is a plasma processing apparatus for effecting intended processing on a work in plasma, and particularly a plasma processing apparatus including any one of the foregoing plasma producing apparatuses.

In this plasma processing apparatus using the foregoing plasma producing apparatus, the plasma can be controlled to keep the low electron temperature and the high-density plasma corresponding to the number of antennas and the like can be achieved without causing an unignorable problem in plasma density. Therefore, the apparatus can suppress damages to the work and the like by the plasma, and can rapidly effect the intended processing on the work.

A plasma processing apparatus of another embodiment of the invention is a plasma processing apparatus of the type mentioned above. In the apparatus, a holder is arranged in the plasma producing chamber for holding the work with its plasma processing target surface opposed to the high-frequency antennas, and at least a part of an inner wall surface of the plasma producing chamber is covered with an electrically insulating member.

When the wall of the plasma producing chamber is exposed to the plasma, components of the chamber wall may be physically and/or chemically brought out, and such components may adhere to or move into the work or a film formed on the work (in the case where the plasma processing device is a film deposition apparatus) so that the intended plasma processing may be hindered. In connection with, the electrically insulating member covers at least a part of the inner surface of the wall of the plasma producing chamber, and suppresses movement of unpreferable chamber wall components from the chamber wall.

In the above plasma processing apparatus, the intended processing is effected on the work similarly to the plasma processing apparatus achieving the third object, and further can be rapidly performed, e.g., while. suppressing damages to the work and the like by the plasma, and further the plasma processing can be performed while suppressing adhesion and mixing of unpreferable impurities.

In the plasma processing apparatus, the inner surface of the plasma producing chamber wall may be entirely covered with the electrically insulating member. In this case, however, the plasma potential may rise, and the plasma may cause unignorable damages to the work or the film formed on the work (in the case where the plasma processing apparatus is the film deposition apparatus).

The following preferable examples may be employed for covering the inner surface of the chamber wall with the electrically insulating member. In the following examples, the electrically insulating member covers a portion of the inner surface of the chamber wall, and particularly covers the portion near the antenna where the plasma density becomes high.

(1) The electrically insulating member covers an inner surface of the plasma producing chamber wall, and particularly an inner surface of a wall portion where the high-frequency antennas are arranged, and to which a plasma processing target surface of the work held by the holder is opposed.

(2) The electrically insulating member covers an inner surface of the plasma producing chamber wall, and particularly an inner surface of a wall portion where the high-frequency antennas are arranged, and to which a plasma processing target surface of the work held by the holder is opposed as well as an inner surface of a side peripheral portion of the plasma producing chamber wall surrounding sideways the holder.

(3) The electrically insulating member locally covers each of antenna surrounding portions included in an inner surface portion of the plasma producing chamber wall and each neighboring to the high-frequency antenna, and the high-frequency antennas are arranged on the above inner surface portion.

In any one of the above cases, the plasma processing apparatus may be a plasma CVD apparatus, an apparatus forming a film by effecting sputtering on a sputter target in plasma, an etching apparatus using plasma, an apparatus performing ion implantation or ion doping by extracting ions from plasma, or an apparatus using the above apparatus and producing various semiconductor devices (e.g., thin-film transistors used in liquid crystal displays and others), material substrates of the semiconductor devices or the like.

In a specific example, the plasma processing apparatus may be a thin film forming apparatus that includes a gas supply device supplying a gas into the plasma producing chamber for film formation, generates an inductively coupled plasma by applying a high-frequency power from the high-frequency antennas to the gas supplied from the gas supply device into the plasma producing chamber, and form a thin film on the work under the plasma.

In another specific example of the plasma processing apparatus, the gas supply device supplies the gas for forming a silicon film on a plasma processing target surface of the work into the plasma processing chamber, and the film formed on the work is a silicon film.

In any one of the above cases, the electrically insulating member may be a member made of a material having resistivity of $1\times10^4$ ohm·cm or more. The electrically insulating material exhibiting a resistivity of $1\times10^4$ ohm·cm or more is, for example, at least one kind of material selected from quartz ($SiO_2$), alumina($Al_2O_3$), aluminum nitride(AlN), yttria ($Y_2O_3$) and silicon carbide(SiC).

Embodiments of the invention will now be described with reference to the drawings.

Figure 1:
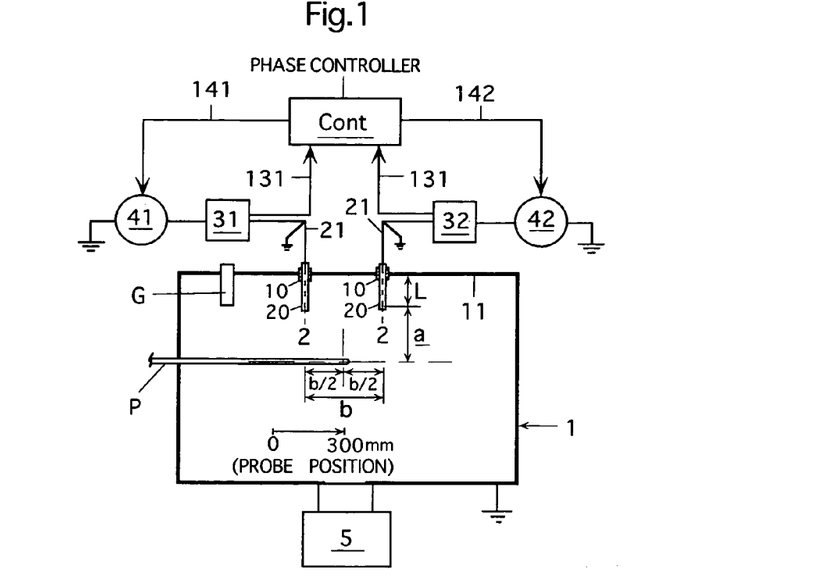
FIG. 1 shows an example of a plasma producing apparatus according to the invention.
Figure 2:
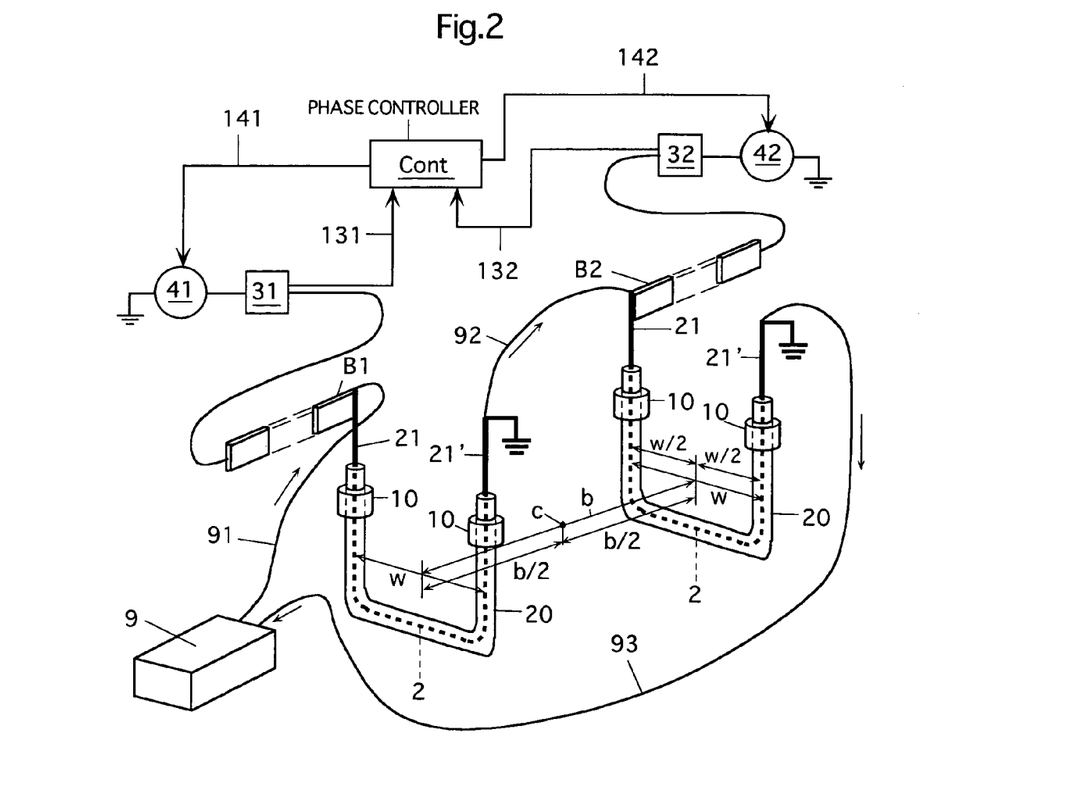
FIG. 2 shows high-frequency antennas and others of the plasma producing apparatus in FIG. 1.

FIG. 1 shows an example of a plasma producing apparatus according to the invention. FIG. 2 illustrates high-frequency antennas and others in the plasma producing apparatus in FIG. 1.

The plasma producing apparatus in FIG. 1 includes a plasma producing chamber 1. Two high-frequency discharge antennas 2 are inserted into the plasma producing chamber 1 through a top wall 11 of the chamber 1, and are located in the chamber. Each high-frequency antenna 2 is covered with an insulating member 20, and is inserted together with the electrically illustrating member 20 through an electrically insulating member 10 arranged at the top wall 11.

The two antennas 2 in this example have the same size, and each have a U-or substantially U-shaped form. These antennas 2 are arranged in a fashion of parallel arrangement, and thus are opposed to each other.

One (left in FIG. 1) of the antennas 2 has portions 21 and 21' projected outward from the chamber through the chamber top wall 11. One (21) of these portions 21 and 21' is connected to a power supply bus bar B1 in FIG. 2 (not shown in FIG. 1). The bus bar B1 is connected to a high-frequency power source 41 via a matching box 31. The other portion 21' is grounded.

The other (right in FIG. 1) of the antennas 2 also has portions 21 and 21' projected outward from the chamber through the chamber top wall 11. One (21) of these portions is connected to a power supply bus bar B2 in FIG. 2 (not shown in FIG. 1), and the bus bar B2 is connected to a high-frequency power source 42 via a matching box 32. The other portion 21' is grounded.

In the example shown in FIGS. 1 and 2, the two neighboring antennas 2 in the chamber 1 are supplied with the high-frequency power such that these antennas 2 may have the same polarity and, in other words, these antennas 2 may be supplied with the power in the same direction, i.e., may be supplied with the currents in the same direction. The above power supply is effected on the projected portions 21 on the same side of these antennas 2 as shown in FIG. 2.

Each antenna 2 is formed of an electrically conductive tube or pipe, and is configured such that a coolant circulating device 9 in FIG. 2 (not shown in FIG. 1) passes a coolant (cooling water in this example) through the antennas for cooling them. More specifically, the cooling water can flow through pipes 91, 92 and 93 shown in FIG. 2 for cooling the antennas. The insulating member 20 covering the antenna 2 is an insulating tube.

The conductive tube forming the antenna in this example is made of copper, and has a circular section. However, these are not restrictive, and the antenna may be formed of a tube made of aluminum or a conductive material other than the copper and aluminum. It is not essential that the antenna is formed of a tube, and the antenna 2 may be formed of a rod having, for example, a circular section and made of a conductive material such as copper or aluminum.

The insulating member 20 covering the antenna 2 in this example is quartz tube. However, this is not restrictive, and the member 20 may be a tube made of an insulating material such as alumina. The insulating member 20 may be formed of a member other than the tube, and may be formed by coating the antenna 2 with an insulating material.

The plasma producing apparatus in FIG. 1 further includes a gas inlet portion G for passing a predetermined gas into the plasma producing chamber 1, and an exhaust device 5 for exhausting the gas from the chamber to attain a predetermined plasma production pressure in the chamber 1.

The plasma producing apparatus in FIG. 1 further includes a phase controller Cont, to which the matching boxes 31 and 32 are connected via phase detection cables 131 and 132, respectively. The controller Cont is also connected to the high-frequency power sources 41 and 42 via phase control cables 141 and 142, respectively.

The controller Cont compares the phases of the high-frequency voltages that is supplied from the matching boxes 31 and 32 via the cables 131 and 132, respectively, with a predetermined phase set in the controller Cont. Thereby, the controller Cont controls the high-frequency power sources 41 and 42 such that the phase of the high-frequency voltage applied to the antenna 2 from each of the high-frequency power sources 41 and 42 may match with the phase set in the controller Cont.

Figure 3A:
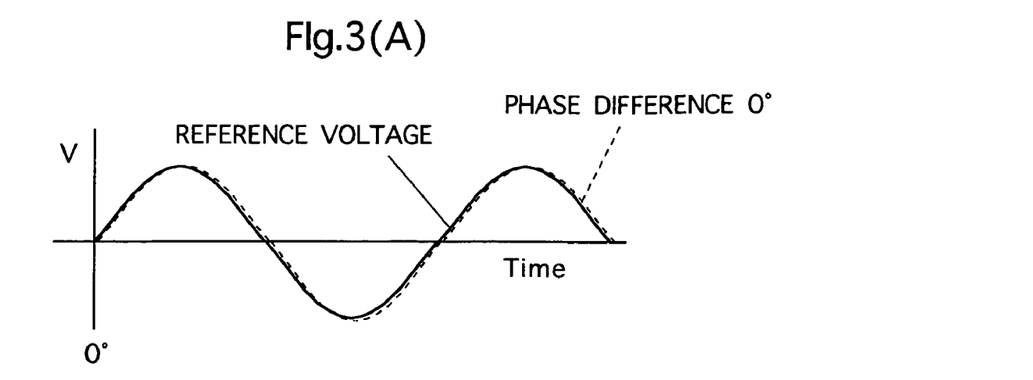
FIGS. 3(A), 3(B) and 3(C) illustrates an example of phase differences between high-frequency voltages applied to two high-frequency antennas.
Figure 3B:
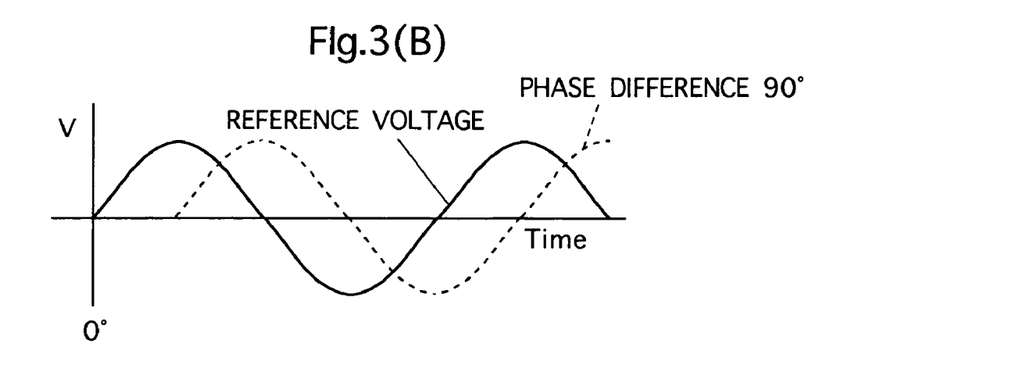
Figure 3C:
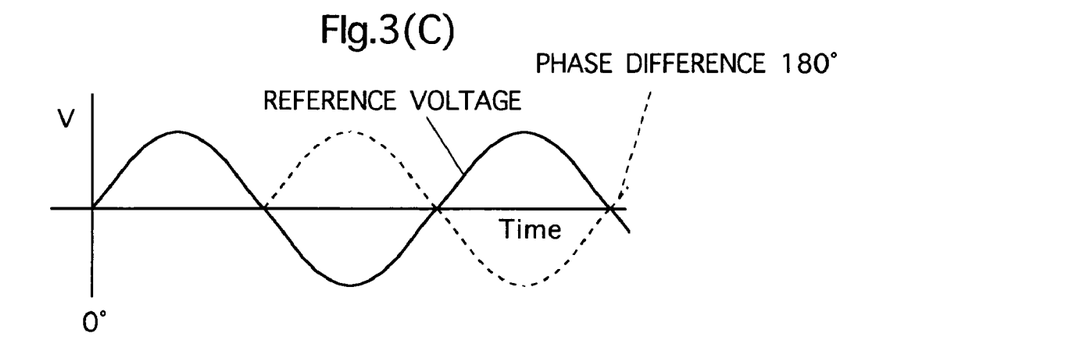

FIGS. 3(A), 3(B) and 3(C) illustrate voltage waveforms appearing in the cases where the voltage provided from the power source 42 exhibit phase differences of 0 degrees (FIG. 3(A)), 90 degrees (FIG. 3(B)) and 180 degrees (FIG. 3(C)) with respect to the reference voltage which is in this case the voltage provided from power source 41. Although FIG. 3(A) illustrates the voltage waveform (dotted line) of the phase difference of 0 degrees shifted from the reference voltage waveform, this is for the sake of illustration, and the shifting does not actually occur between them.

In the plasma producing apparatus illustrated in FIGS. 1 and 2, the high-frequency powers are supplied to the projected portions 21 on the same side of the antennas 2 so that these antennas 2 may have the same polarity. In this plasma producing apparatus, the high-frequency voltage applied to one of the antennas 2 (e.g., the high-frequency voltage applied to the antenna 2 from the power source 41) is handled as the reference voltage, and the high-frequency voltage (e.g., the high-frequency voltage applied to the antenna 2 from the power source 42) is applied to the other antenna 2 with the phase difference of 180 degrees with respect to the reference voltage under the control of the controller Cont, whereby the electron temperature of the plasma can be kept low.

According to the plasma producing apparatus already described with reference to FIGS. 1 and 2, the exhaust device 5 discharges the gas from the plasma producing chamber 1 to lower the chamber pressure below the predetermined plasma producing pressure, and then the predetermined gas is introduced through the gas inlet portion G into the chamber 1 while setting and maintaining the predetermined plasma producing pressure in the chamber by the exhaust device 5. In this state, the power sources 41 and 42 supply the high-frequency powers to the antennas 2 so that the inductively coupled plasma can be produced in the chamber 1.

Under the control of controller Cont, the power source (e.g., 41) applies the predetermined reference high-frequency voltage to one of the antennas 2, and the power source 42 applies the high-frequency voltage to the other antenna 2 with the phase difference of 180 degrees with respect to the reference high-frequency voltage. Thereby, the electron temperature of the inductively coupled plasma thus produced can be kept low.

As described above, the two antennas 2 are opposed to each other, and are arranged in the fashion of parallel arrangement, and the phase difference of 180 degrees is attained between the high-frequency voltages. Thereby, the plasma electron temperature can be kept low, and the high-density plasma corresponding the number of the high-frequency antennas can be obtained without causing unignorable lowering of the plasma density.

Description will now be given on an experimental example 1 of the inductively coupled plasma production that was performed with the plasma producing apparatus of the type shown in FIGS. 1 and 2.

EXPERIMENTAL EXAMPLE 1

(1) Plasma Generation Conditions

High-frequency Power: Power of 13.56 MHz and 1250 W was supplied to each of the two antennas.

Plasma Producing Pressure: 1.8 Pa

Kind and Amount of Supplied Gas: Hydrogen gas, 300 cc/minute

Initially, the plasma producing chamber was depressurized to the order of $10^{-5}$ Pa, then the hydrogen gas was supplied at 300 cc/minute and the chamber pressure was kept at 1.8 Pa.

(2) Antenna and Insulating Tube Conditions

Material of Each Antenna: A circular copper pipe having an outer diameter of ¼ inch (about 6.35 mm) and a wall thickness of 1 mm was bent into a U-shaped form. Cooling water could flow therethrough.

Horizontal Width w (see FIG. 2) of Each Antenna: 55 mm

Vertical Length of Each Antenna: 250 mm (Length L in the chamber 1=100 mm)

Distance b between the parallel opposed antennas:b =340 mm

Each Insulating Tube Covering Antenna: Quartz(silica) tube having an outer diameter of 16 mm and an inner diameter of 12 mm.

Under the above conditions, the inductively coupled plasma was produced with the phase differences of 0 degrees, 90 degrees and 180 degrees caused between the high-frequency voltages applied to the two antennas, respectively. In connection with each of the phase differences, the electron temperature (eV) and electron density (pcs(pieces)/cm$^3$) were measured, and the plasma was evaluated.

Each of the measuring of the electron temperature and electron density was performed as follows. A Langmuir probe P was located immediately under a central position c (see FIG. 2) between the two antennas on a horizontal plane perpendicular to the antennas, and was spaced by a distance a (see FIG. 1) of 175 mm from the lower end of the antenna. This position of the probe P was handled as a position of 300 mm, and the probe P was successively moved horizontally by 50 mm at a time.

Figure 4:
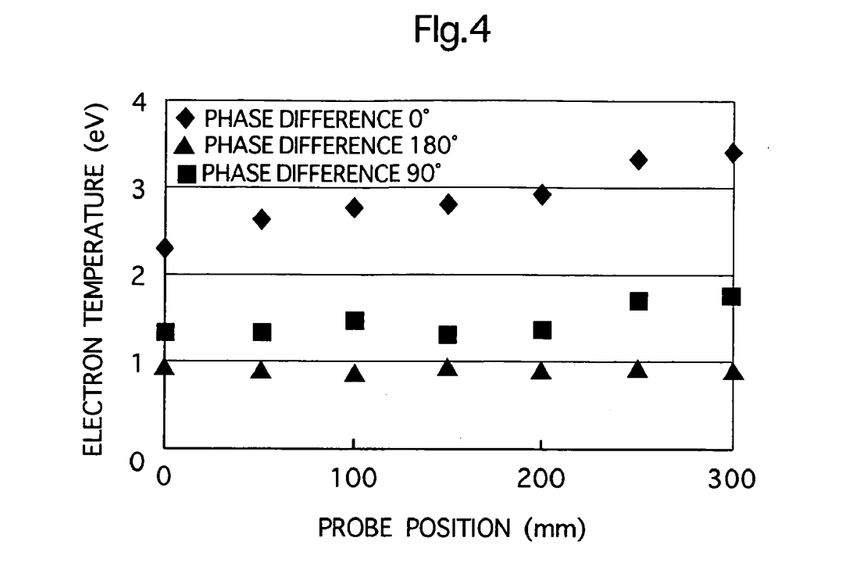
FIG. 4 illustrates a result of measurement of a plasma electron temperature in an experimental example of plasma production by the plasma producing apparatus of a type shown in FIG. 1.
Figure 5:
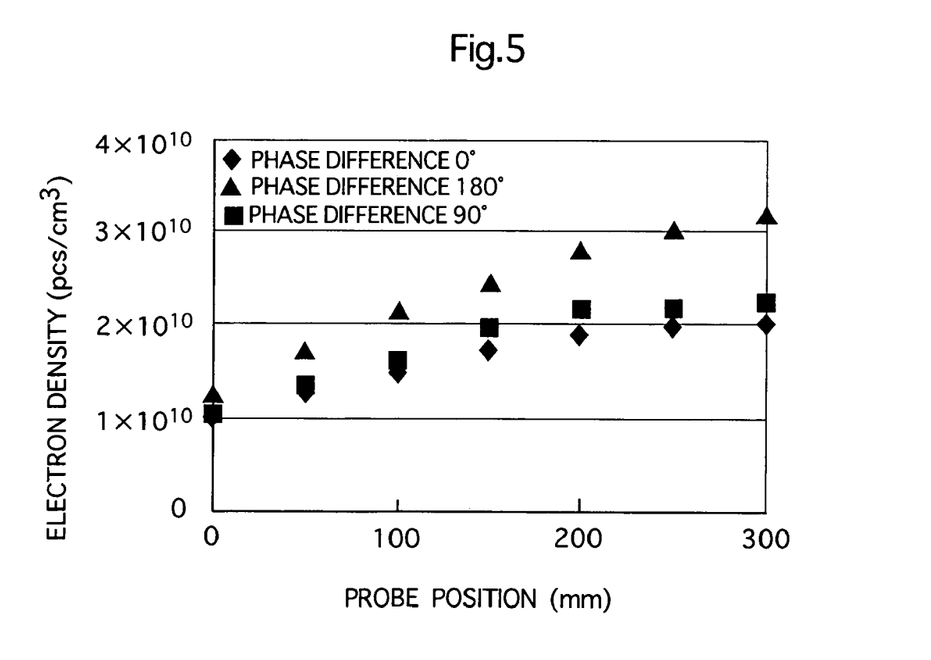
FIG. 5 illustrates a result of measurement of a plasma electron density in an experimental example of plasma production by the plasma producing apparatus of the type shown in FIG. 1.

FIG. 4 illustrates a result of the measurement of the electron temperature (eV), and FIG. 5 illustrates a result of the measurement of the electron density.

As can be seen from FIGS. 4 and 5, the lowest electron temperature was attained when the phase difference was 180 degrees. When the phase difference was 180 degrees, the electron density that is generally deemed as an index of plasma density was likewise larger than those in the cases where the phase difference was 0 degrees and 90 degrees, and the maximum density was attained, It can be considered that the changes in electron temperature corresponding to the phase difference are caused by the interference between the induction fields caused by the flow of the high-frequency currents through the antennas. In the state of the mutual interference, it can be considered that the induction fields weaken each other, and this results in a state that the intensity of the induction field accelerating the electrons lowers so that the electron temperature lowers. In the apparatus of the type shown in FIG. 1, both the antennas are supplied with the high-frequency powers in the same directions, and therefore the induction fields occur in the same direction when the phase difference is 0 degrees. When the phase difference is 180 degrees, the induction fields occur in the opposite directions, respectively.

Even when the induction field weakened each other, the electron density increased as illustrated in FIG. 5, and no disadvantage occurred in electron density. It can be considered that the lowest electron temperature was caused by the phase difference of 180 degrees because the interference between the induction fields occurred to the highest extent.

Figure 6:
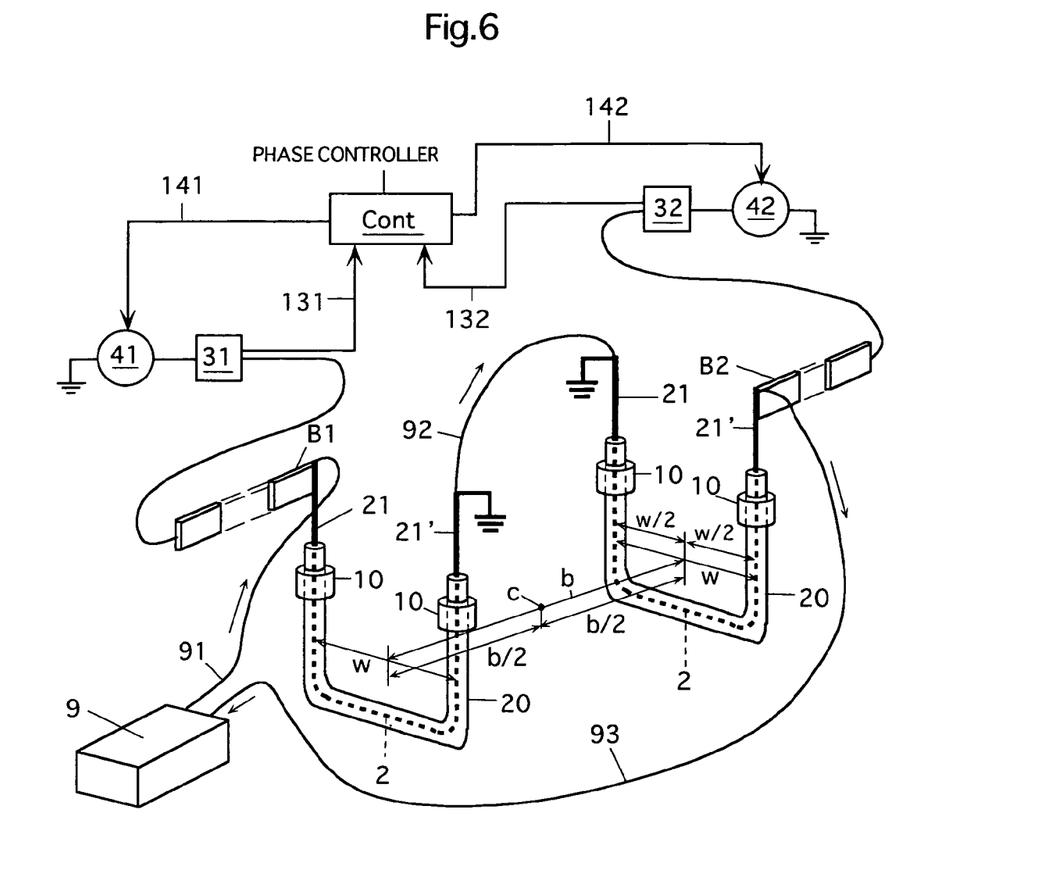
FIG. 6 shows high-frequency antennas and others in another example of the plasma producing apparatus according to the invention.

In the plasma producing apparatus-described above, the high-frequency powers are supplied to the projected portions 21 on the same side of the antennas 2 such that both the antennas 2 may have the same polarity. However, as shown in FIG. 6, the power source 41 may supply the high-frequency power to the portion 21 of the antenna 21 corresponding to this power source 41, and the power source 42 may supply the high-frequency power to the portion 21' of the antenna 2 corresponding to the power source 42 such that the antennas 2 may have the opposite polarities, respectively, and thus the antennas 2 may be supplied with the powers in the opposite directions, i.e., the currents flowing in the opposite directions, respectively. In FIG. 6, the substantially same portions and parts as those in FIGS. 1 and 2 bear the same reference symbols.

Description will now be given on an experimental example 2 of production of the inductively coupled plasma that was performed with the plasma producing apparatus of the type employing the power supply method illustrated in FIG. 6.

EXPERIMENTAL EXAMPLE 2

(1) Plasma Generating Conditions

These are the same as the conditions in the experimental example 1.

(2) Antenna and Insulating Tube Conditions

These are the same as the conditions in the experimental example 1.

Under the above conditions, the inductively coupled plasma was produced with the phase differences of 0 degrees, 90 degrees and 180 degrees caused between the high-frequency voltages applied to the two antennas. In connection with each of the phase differences, the electron temperature (eV) and electron-density ($pcs/cm^3$) were measured, and the plasma was evaluated. The measuring method and conditions were the same as those in the experimental example 1.

Figure 7:
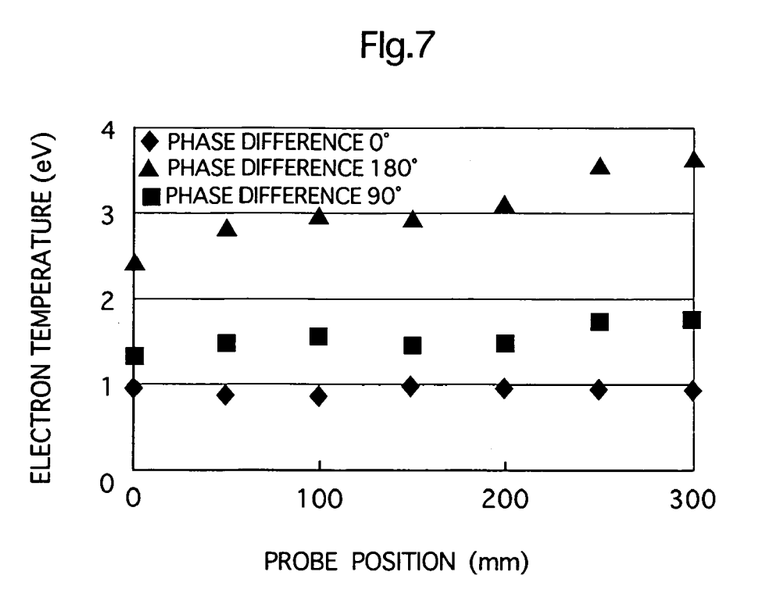
FIG. 7 illustrates a result of measurement of a plasma electron temperature in an experimental example of plasma production by the plasma producing apparatus of the type employing the structure shown in FIG. 6.
Figure 8:
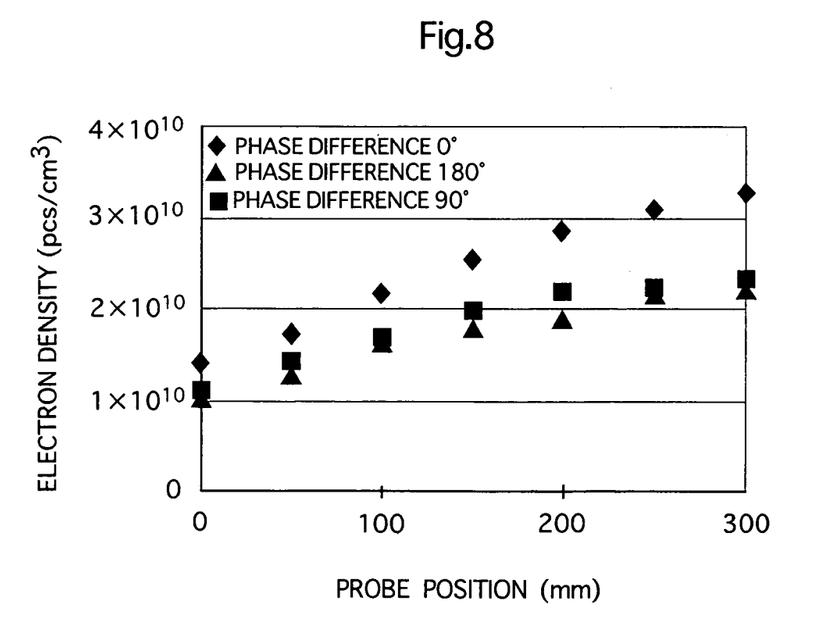
FIG. 8 illustrates a result of measurement of the plasma electron density in an experimental example of plasma production by the plasma producing apparatus of the type employing the structure shown in FIG. 6.

FIG. 7 illustrates a result of the measurement of the electron temperature (eV), and FIG. 8 illustrates a result of the measurement of the electron density.

As can be seen from FIGS. 7 and 8, the lowest electron temperature was attained when the phase difference was 0 degrees. When the phase difference was 0 degrees, the electron density that is generally deemed as an index of plasma density was likewise larger than those in the cases where the phase difference was 90 degrees and 180 degrees, and the maximum density was attained.

In the case of the experimental example 2, since the two antennas were supplied with the high-frequency powers in the opposite directions, respectively, the induction fields occur in the opposite directions, respectively, when the phase difference is 0 degrees. When the phase difference is 180 degrees, the induction fields occur in the same direction. Therefore, it can be considered that the weakening of the induction fields occurred oppositely to that in the experimental example 1, and thereby the above result was achieved.

Even when the induction fields weakened each other, the electron density increased as illustrated in FIG. 8, and no disadvantage occurred in electron density. It is considered that the lowest electron temperature was attained with the phase difference of 0 degrees because the interference between the induction fields occurred to the maximum extent.

Although each of the plasma producing apparatuses described above employs the two high-frequency antennas, it may employ three or more high-frequency antennas. In the latter case, the electron temperature of the plasma can be kept low by the following configuration (1) or (2).

(1) The high-frequency voltages of the phase difference of 180 degrees are applied to the neighboring high-frequency antennas that are supplied with the high-frequency powers in such a manner that the neighboring antennas have the same polarity and, in other words, the powers in the same directions and thus the currents in the same directions are supplied, respectively.

(2) The high-frequency voltages of the phase difference of 0 degrees are applied to the neighboring high-frequency antennas that are supplied with the high-frequency powers in such a manner that the neighboring antennas have the opposite polarities, respectively and, in other words, the powers in the opposite directions and thus the currents in the opposite directions are supplied, respectively.

Figure 9:
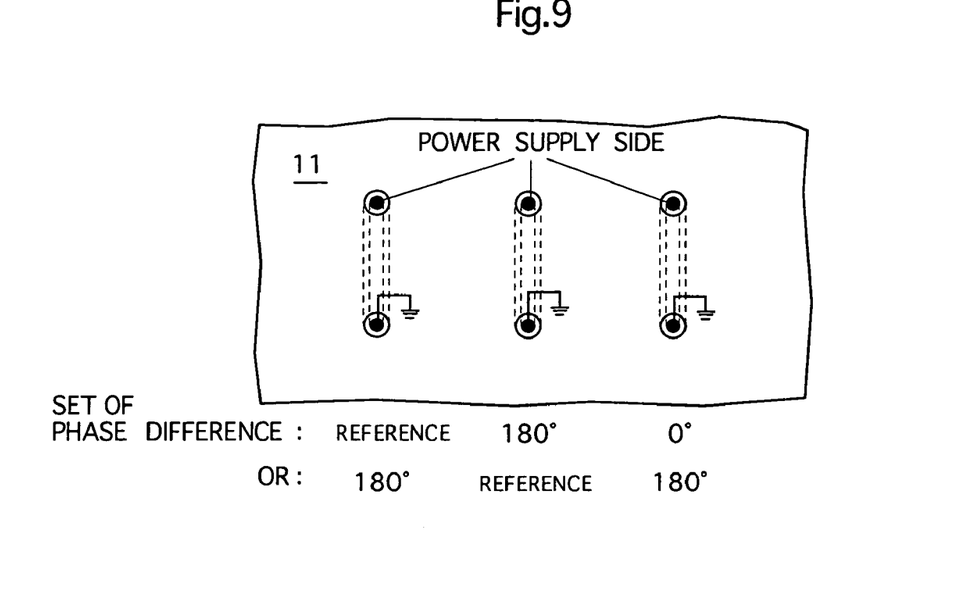
FIG. 9 illustrates an example of phase differences between the high-frequency voltages applied to neighboring antennas among three high-frequency antennas.
Figure 10:
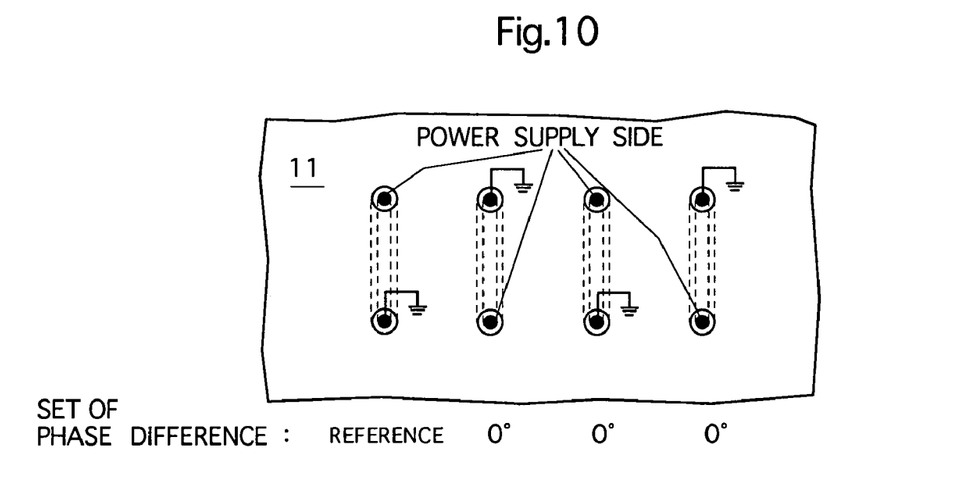
FIG. 10 illustrates an example of phase differences between the high-frequency voltages applied to neighboring antennas among four high-frequency antennas.

FIG. 9 illustrates a phase difference in high-frequency voltage that appears between the neighboring antennas when three antennas are employed and the foregoing configuration (1) is employed for power supply. FIG. 10 illustrates a phase difference in high-frequency voltage that appears between the neighboring antennas when four antennas are employed and the foregoing configuration (2) is employed for power supply.

The plasma producing apparatuses described above can be used for providing various plasma processing apparatuses. For example, it is possible to provide plasma processing apparatuses such as a plasma CVD apparatus, an apparatus forming a film by effecting sputtering on a sputter target in plasma, an etching apparatus using plasma, an apparatus performing ion implantation or ion doping by extracting ions from plasma, and an apparatus using the above apparatus and producing various semiconductor devices (e.g., thin-film transistors used in liquid crystal displays and others), material substrates of the semiconductor devices or the like.

Figure 11:
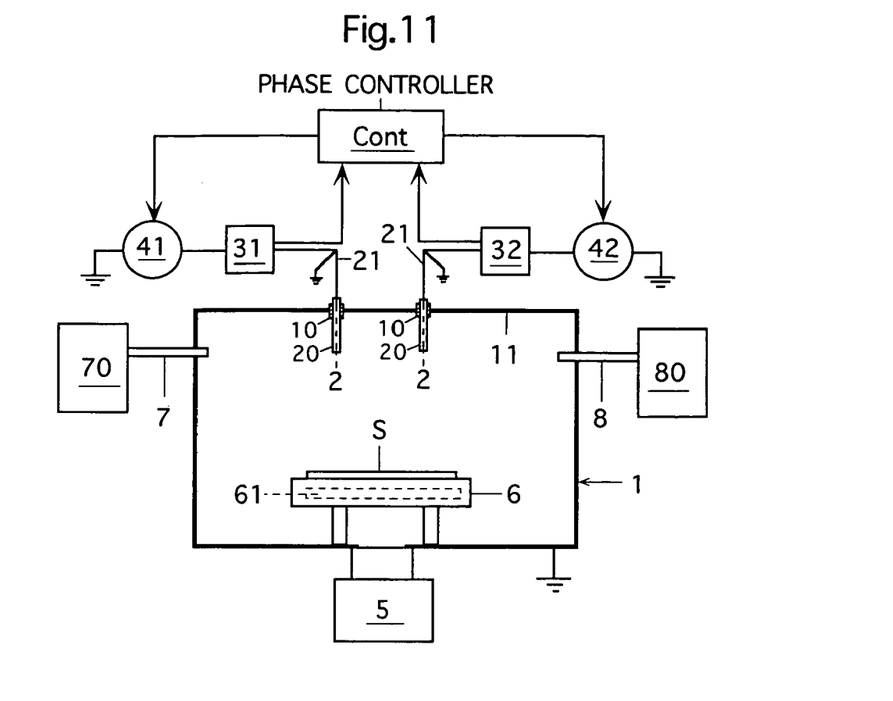
FIG. 11 shows an example (plasma CVD apparatus) of a plasma processing apparatus according to the invention.

FIG. 11 shows an example of a plasma CVD apparatus using the plasma producing apparatus shown in FIG. 1. The plasma CVD apparatus in FIG. 11 differs from the plasma producing apparatus shown in FIG. 1 in that plasma producing chamber 1 serves also as a deposition chamber, a holder 6 internally provided with a heater 61 is arranged in the chamber 1 for holding a work substrate S, gas inlet pipes 7 and 8 are employed as the gas inlet portion, the pipe 7 is connected to a monosilane gas supply device 70 and the pipe 8 is connected to a hydrogen gas supply device 80. This CVD apparatus is a silicon thin-film forming apparatus that can form a silicon thin film on the substrate S.

For example, silicon thin film forming apparatuses such as the apparatus shown in FIG. 11 often employ such a structure that the wall of the plasma producing chamber 1 is made of an alloy of aluminum having a high anticorrosion property with respect to a cleaning gas for cleaning silicon deposited on the plasma producing chamber wall in the silicon film forming processing by the plasma of the cleaning gas. In this case, the aluminum may be derived from the plasma producing chamber wall when forming the silicon film on the substrate S, and this aluminum serving as impurities may adhere onto or may move into the silicon film formed on the substrate S.

In the plasma processing apparatus according to the invention, as already described, at least a part of the inner surface of the chamber wall of the plasma producing chamber may be covered with an electrically insulating member so that the plasma processing can be performed while suppressing adhesion and mixing of unpreferable impurities.

Examples of the above will now be described with reference to FIGS. 12(A), 12(B), 13, 14(A) and 14(B).

Figure 12A:
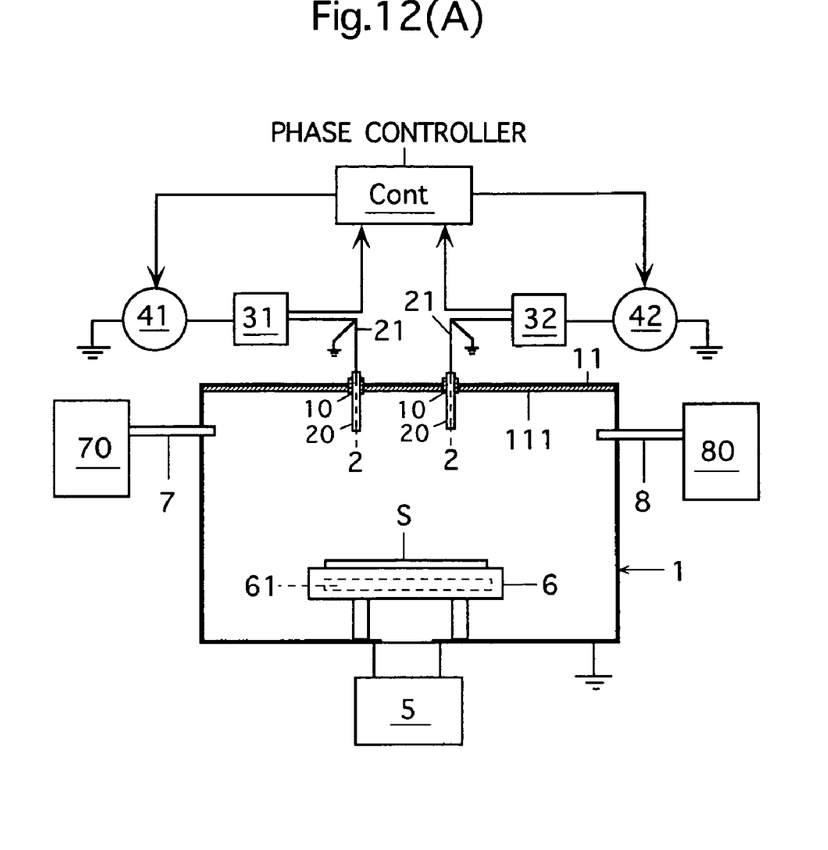
FIG. 12(A) is another example (plasma CVD apparatus) of a plasma processing apparatus according to the invention.
Figure 12B:
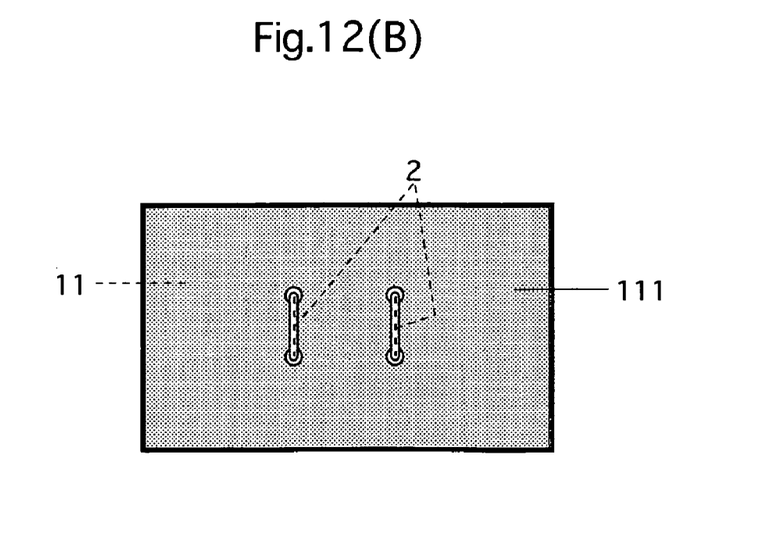
FIG. 12(B) is a bottom view of a top wall of a plasma producing chamber.

FIG. 12(A) shows a silicon thin film forming apparatus that differs from the silicon thin film forming apparatus (an example of the plasma processing apparatus) shown in FIG. 11 in that an electrically insulating plate 111 (a quartz plate in this example, or an alumina plate or the like) covers entirely the inner surface of the top wall 11 of the plasma producing chamber 1 that is provided with the high-frequency antennas 2, and is opposed to the film deposition target surface of the substrate S held by the holder 6. FIG. 12(B) is a bottom view of a portion of the top wall 11 of the plasma producing chamber 1.

Figure 13:
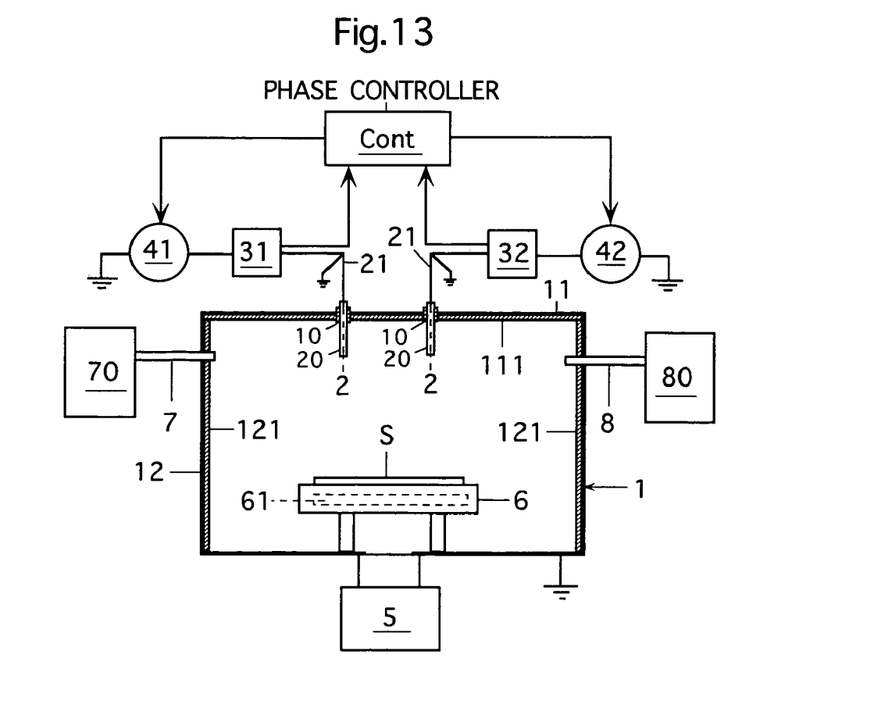
FIG. 13 is still another example (plasma CVD apparatus) of a plasma processing apparatus according to the invention.

FIG. 13 shows a silicon thin film forming apparatus that differs from the silicon thin film forming apparatus shown in FIG. 11 in that electrically insulating members (quartz plates in this example) 111 and 121 cover the walls defining the plasma producing chamber 1, and particularly cover entirely the inner surface of the top wall 11 and the inner surface of the side peripheral wall 12 surrounding sideways the holder 6.

Figure 14A:
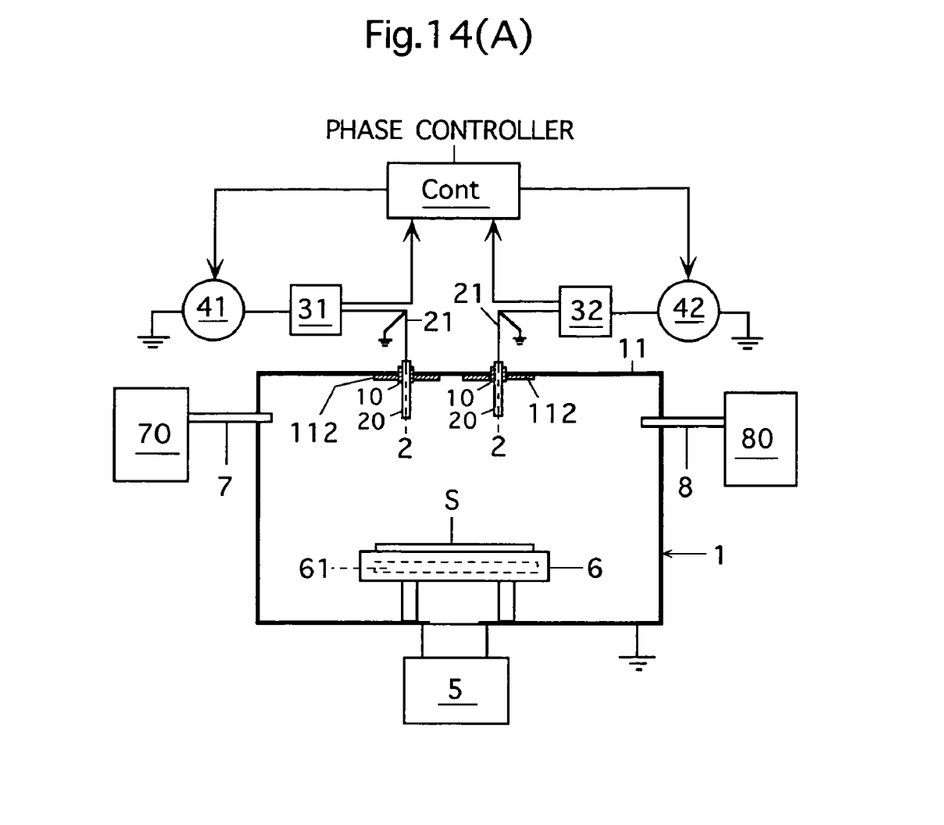
FIG. 14(A) is yet another example (plasma CVD apparatus) of a plasma processing apparatus according to the invention.
Figure 14B:
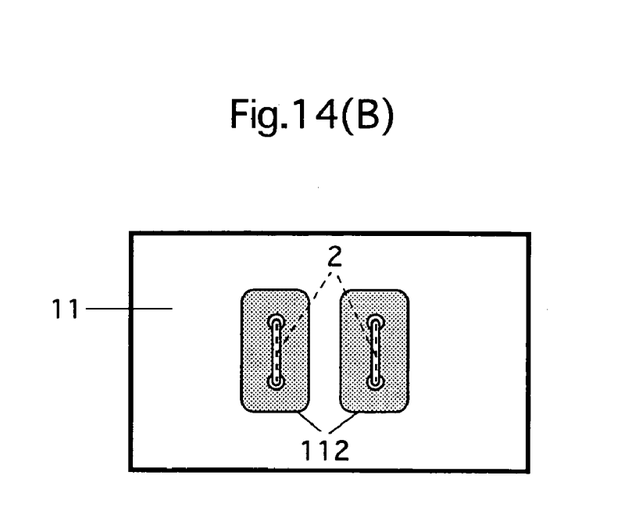
FIG. 14(B) is a bottom view of a top wall of a plasma producing chamber.

FIG. 14(A) shows a silicon thin film forming apparatus that differs from the silicon thin film forming apparatus shown in FIG. 11 in that electrically insulating members (quartz plates in this example) 112 cover the wall defining the plasma producing chamber 1, and particularly cover locally portions of the inner surface of the top wall 11 neighboring to and located around each high-frequency antenna 2. FIG. 14(B) is a bottom view of a portion of the top wall 11 of the plasma producing chamber 1.

When at least a part of the inner surface of the wall of the plasma producing chamber is covered with the electrically insulation member, the inner surface of the plasma producing chamber wall may be entirely covered with the electrically insulating member. This configuration can sufficiently suppress adhesion and mixing of the aluminum originating from the plasma producing chamber wall onto or into the silicon film formed on the substrate S. However, when the electrically insulating member covers entirely the inner surface of the plasma producing chamber wall, the plasma potential rises, and the plasma may cause unignorable damages to the substrate S and the silicon film formed thereon. Therefore, in the silicon thin film forming apparatuses shown in FIGS. 12(A), 13 and 14(A), the electrically insulating member does not cover entirely the inner surface of the plasma producing chamber wall, but covers partially the inner surface.

When the silicon thin film forming apparatuses shown in FIGS. 11, 12(A), 13 and 14(A) have the plasma producing chambers 1 of which walls are made of the alloy of aluminum, the aluminum originating from the plasma producing chamber may adhere to or move into the silicon film formed on the substrate S. The degree of this adhesion and movement (mixing) can be suppressed in the apparatus provided with the electrically insulating member as shown in FIG. 12(A), 13 or 14(A) as compared with the apparatus in FIG. 11 not having the electrically insulating member covering the inner surface of the plasma producing chamber wall.

In the apparatus shown in FIG. 14(A), a total area of the quartz plates 112 covering the top wall 11 of the plasma producing chamber 1 is smaller than the total area of the quartz plates of each of the apparatuses in FIGS. 12(A) and 13, and therefore the apparatus in FIG. 14(A) can suppress the adhesion and mixing of the aluminum onto or into the silicon film to a slightly lower extent than those in FIGS. 12(A) and 13. However, the apparatus in FIG. 14(A) is provided with the quarts plates 112 neighboring to the antennas 2 around which the plasma density becomes high, and therefore can suppress the adhesion and mixing to an extent that can practically make them ignorable. Further, the area of each quartz plate 112 covering the plasma producing chamber wall can be small, and this can suppress the rising of the plasma potential, and can suppress damages to the silicon film due to the plasma.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma producing method comprising:
    arranging a plurality of high-frequency antennas in a plasma producing chamber, and
    generating an inductively coupled plasma by applying a high-frequency power from the high-frequency antennas to a gas in the plasma producing chamber,
    wherein at least some of the high-frequency antennas are arranged in a parallel arrangement such that the antennas successively neighbor to each other and the neighboring antennas are arranged on different planes parallel or substantially parallel to each other and are opposed to each other, and
    wherein control is conducted on a phase of a high-frequency voltage applied to each of the high-frequency antennas arranged in the parallel arrangement to thereby control an electron temperature of the inductively coupled plasma.

2. A plasma producing method comprising:
    arranging a plurality of high-frequency antennas in a plasma producing chamber, and
    generating an inductively coupled plasma by applying a high-frequency power from the high-frequency antennas to a gas in the plasma producing chamber,
    wherein at least some of the high-frequency antennas are arranged in a parallel arrangement such that the antennas successively neighbor to each other and each of the antennas is opposed to the neighboring antenna,
    wherein control is conducted on a phase of a high-frequency voltage applied to each of the high-frequency antennas arranged in the parallel arrangement to thereby control an electron temperature of the inductively coupled plasma, and
    wherein each of the high-frequency antennas arranged in the parallel arrangement is supplied with the high-frequency power such that (A) the neighboring high-frequency antennas among the plurality of antennas have same polarity, and phase difference in high-frequency voltage between the neighboring high-frequency antennas becomes equal to 180 degrees, or (B) the neighboring high-frequency antennas among the plurality of antennas have opposite polarities, respectively, and phase difference in high-frequency voltage between the neighboring high-frequency antennas becomes equal to 0 degrees.

3. A plasma producing method comprising:
    arranging a plurality of high-frequency antennas in a plasma producing chamber, and
    generating an inductively coupled plasma by applying a high-frequency power from the high-frequency antennas to a gas in the plasma producing chamber,
    wherein at least some of the high-frequency antennas are arranged in a parallel arrangement such that the antennas successively neighbor to each other and each of the antennas is opposed to the neighboring antenna,
    wherein control is conducted on a phase of a high-frequency voltage applied to each of the high-frequency antennas arranged in the parallel arrangement to thereby control an electron temperature of the inductively coupled plasma, and
    wherein each of the high-frequency antennas arranged in the parallel arrangement is supplied with the high-frequency power such that the neighboring high-frequency antennas among the plurality of antennas have same polarity, and phase difference in high-frequency voltage between the neighboring high-frequency antennas becomes equal to 180 degrees.

4. A plasma producing method comprising:
    arranging a plurality of high-frequency antennas in a plasma producing chamber, and
    generating an inductively coupled plasma by applying a high-frequency power from the high-frequency antennas to a gas in the plasma producing chamber,
    wherein at least some of the high-frequency antennas are arranged in a parallel arrangement such that the antennas successively neighbor to each other and each of the antennas is opposed to the neighboring antenna,
    wherein control is conducted on a phase of a high-frequency voltage applied to each of the high-frequency antennas arranged in the parallel arrangement to thereby control an electron temperature of the inductively coupled plasma, and wherein each of the high-frequency antennas arranged in the parallel arrangement is supplied with the high-frequency power such that the neighboring high-frequency antennas among the plurality of antennas have opposite polarities, respectively, and phase difference in high-frequency voltage between the neighboring high-frequency antennas becomes equal to 0 degrees.

5. A plasma producing apparatus comprising:
a plasma producing chamber,
a plurality of high-frequency antennas arranged in the chamber, and
a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas,
wherein at least some of the high-frequency antennas are arranged in a parallel arrangement such that the antennas successively neighbor to each other and the neighboring antennas are arranged on different planes parallel or substantially parallel to each other and are opposed to each other, and
wherein the high-frequency power supply device controls a phase of a high-frequency voltage applied to each of the high-frequency antennas arranged in the parallel arrangement to thereby control an electron temperature of the inductively coupled plasma.

6. A plasma producing apparatus comprising:
a plasma producing chamber,
a plurality of high-frequency antennas arranged in the chamber, and
a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas,
wherein at least some of the high-frequency antennas are arranged in a parallel arrangement such that the antennas successively neighbor to each other and each of the antennas is opposed to the neighboring antenna,
wherein the high-frequency power supply device controls a phase of a high-frequency voltage applied to each of the high-frequency antennas arranged in the parallel arrangement to thereby control an electron temperature of the inductively coupled plasma, and
wherein each of the high-frequency antennas arranged in the parallel arrangement is supplied with the high-frequency power from the high-frequency power supply device such that (A) the neighboring high-frequency antennas among the plurality of antennas have same polarity, and phase difference in high-frequency voltage between the neighboring high-frequency antennas becomes equal to 180 degrees, or (B) the neighboring high-frequency antennas among the plurality of antennas have opposite polarities, respectively, and phase difference in high-frequency voltage between the neighboring high-frequency antennas becomes equal to 0 degrees.

7. A plasma producing apparatus comprising:
a plasma producing chamber,
a plurality of high-frequency antennas arranged in the chamber, and
a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas,
wherein at least some of the high-frequency antennas are arranged in a parallel arrangement such that the antennas successively neighbor to each other and each of the antennas is opposed to the neighboring antenna,
wherein the high-frequency power supply device controls a phase of a high-frequency voltage applied to each of the high-frequency antennas arranged in the parallel arrangement to thereby control an electron temperature of the inductively coupled plasma, and
wherein each of the high-frequency antennas arranged in the parallel arrangement is supplied with the high-frequency power from the high-frequency power supply device such that the neighboring high-frequency antennas among the plurality of antennas have same polarity, and phase difference in high-frequency voltage between the neighboring high-frequency antennas becomes equal to 180 degrees.

8. A plasma producing apparatus comprising:
a plasma producing chamber,
a plurality of high-frequency antennas arranged in the chamber, and
a high-frequency power supply device supplying a high-frequency power to the high-frequency antennas for producing inductively coupled plasma by applying the high-frequency power supplied from the high-frequency power supply device to a gas in the plasma producing chamber from the high-frequency antennas,
wherein at least some of the high-frequency antennas are arranged in a parallel arrangement such that the antennas successively neighbor to each other and each of the antennas is opposed to the neighboring antenna,
wherein the high-frequency power supply device controls a phase of a high-frequency voltage applied to each of the high-frequency antennas arranged in the parallel arrangement to thereby control an electron temperature of the inductively coupled plasma, and
wherein each of the high-frequency antennas arranged in the parallel arrangement is supplied with the high-frequency power from the high-frequency power supply device such that the neighboring high-frequency antennas among the plurality of antennas have opposite polarities, respectively, and phase difference in high-frequency voltage between the neighboring high-frequency antennas becomes equal to 0 degrees.

9. A plasma processing apparatus for effecting intended processing on a work in plasma, comprising the plasma producing apparatus according to any one of the preceding claims 5 to 8.

10. The plasma processing apparatus according to claim 9, wherein
a holder is arranged in said plasma producing chamber for holding said work with its plasma processing target surface opposed to said high-frequency antennas, and at least a part of an inner wall surface of said plasma producing chamber is covered with an electrically insulating member.

11. The plasma processing apparatus according to claim 10, wherein
said electrically insulating member covers an inner surface of a portion of said plasma producing chamber wall, the high-frequency antennas are arranged on said wall portion, and said wall portion is opposed to the plasma processing target surface of the work held by the holder.

12. The plasma processing apparatus according to claim 10, wherein
said electrically insulating member covers an inner surface of a portion of said plasma producing chamber wall, the high-frequency antennas are arranged on said wall portion, said wall portion is opposed to the plasma processing target surface of the work held by the holder, and said electrically insulating member also covers an inner surface of a side peripheral portion of said plasma producing chamber wall surrounding sideways said holder.

13. The plasma processing apparatus according to claim 10, wherein
said electrically insulating member locally covers each of antenna surrounding portions included in an inner surface portion of said plasma producing chamber wall and each neighboring to said high-frequency antenna, and said high-frequency antennas are arranged on said inner surface portion.

14. The plasma processing apparatus according to claim 10, wherein
said electrically insulating member is made of at least one kind of material selected from quartz, alumina, aluminum nitride, yttria and silicon carbide.

15. The plasma processing apparatus according to claims 9, wherein
said plasma processing apparatus is a thin film forming apparatus that includes a gas supply device supplying a gas into said plasma producing chamber for film formation, generates an inductively coupled plasma by applying a high-frequency power from said high-frequency antennas to the gas supplied from the gas supply device into the plasma producing chamber, and forms a thin film on said work under the plasma.

16. The plasma processing apparatus according to claim 15, wherein
said gas supply device supplies the gas for forming a silicon film on the plasma processing target surface of said work into said plasma processing chamber, and the film formed on said work is a silicon film.

* * * * *